United States Patent

Chang

[11] Patent Number: 5,831,330
[45] Date of Patent: Nov. 3, 1998

[54] DIE SEAL STRUCTURE FOR A SEMICONDUCTOR INTEGRATED CIRCUIT

[75] Inventor: Gene Jiing-Chiang Chang, Hsinchu Hsien, Taiwan

[73] Assignee: Winbond Electronics Corp., Hsinchu, Taiwan

[21] Appl. No.: 786,771

[22] Filed: Jan. 21, 1997

[30] Foreign Application Priority Data

Jun. 28, 1996 [TW] Taiwan ................................. 85209826

[51] Int. Cl.$^6$ ................................................ H01L 23/544
[52] U.S. Cl. ........................ 257/620; 257/619; 438/462
[58] Field of Search .................................. 257/619, 620, 257/635; 438/462

[56] References Cited

U.S. PATENT DOCUMENTS

| | | | |
|---|---|---|---|
| 5,414,297 | 5/1995 | Morita et al. ............................ | 257/620 |
| 5,559,362 | 9/1996 | Narita ....................................... | 257/620 |
| 5,665,655 | 9/1997 | White ....................................... | 438/584 |
| 5,698,892 | 12/1997 | Koizumi et al. ......................... | 257/620 |

*Primary Examiner*—Olik Chaudhuri
*Assistant Examiner*—Nathan K. Kelley
*Attorney, Agent, or Firm*—Ladas & Parry

[57] ABSTRACT

A die seal structure for a small-dimension semiconductor integrated circuit is disclosed. The die seal structure, which lies between an integrated circuit region and a scribe line over a semiconductor wafer, includes at least one dielectric layer over the semiconductor wafer. At least one contact window is formed in the dielectric layer. The die seal structure further includes at least one plug each filled in one of the contact windows.

10 Claims, 4 Drawing Sheets

DIE SEAL STRUCTURE FOR A SEMICONDUCTOR INTEGRATED CIRCUIT

BACKGROUND OF THE INVENTION

1. Field of the Invention

The present invention relates to manufacturing of a integrated circuit on a semiconductor wafer, and more specifically, to a die seal structure on a semiconductor wafer.

2. Description of Related Art

In the semiconductor processing, a plurality of dies, each of which contains an integrated circuit, are fabricated on a semiconductor wafer at a time. A scribe line is provided between every two adjacent dies so that the dies can be separated without damaging the circuit after processing. Referring to FIG. 1, die 1 which contains an integrated circuit 3 is surrounded by scribe lines 2. Scribe lines 2 isolate die 1 from other dies 1'. Moreover, in order to prevent the integrated circuit 3 from microcracking due to stress when the wafer is sawed into dies, a die seal 8, including buffer area 4, seal ring 5 and buffer space 6, are provided around integrated circuit 3.

FIG. 2 is a cross-sectional view of the die structure along line II—II. As shown in the figure, integrated circuit 3 is fabricated on silicon wafer 10 over which field oxide layer 11 is formed to isolate the devices in the integrated circuit 3. Seal ring 5 includes three dielectric layers 12, 14, and 16, wherein dielectric layer 14 is formed over dielectric layer 12, and dielectric layer 16 is formed over dielectric layer 14. Each of the dielectric layers 12, 14 and 16 further connects to a metal layer, such as layer 13, 15 and 17 in the figure. Finally, passivation layer 18 covers all the dielectric layers and the metal layers.

In the aforementioned seal ring 5 of a conventional die seal structure, each dielectric layer overlapped with a metal layer is provided between integrated circuit region 3 and scribe line 2. For such a triple-level-metal seal ring structure, the width of the seal ring structure may exceed 20 μm. Moreover, the buffer space 6 is trench 19 which is formed by etching passivation layer 18 and dielectric layers 16, 14 and 12. The depth of trench 19 can reach about 30,000 Å, and the width is between approximately 5 and 10 μm for the triple-level-metal seal ring structure. The width of buffer region 4 between seal ring region 5 and integrated circuit region 3 may exceed 25 μm.

As semiconductor integrated circuits become increasingly complicated, the number of the dielectric layers and metal layers increases and the feature size of the layers decreases. Therefore, trench 19 in the conventional die seal structure will be too deep to form through general photolithography and etching processes. Moreover, since seal ring 5 extends from integrated circuit 3 to scribe line 2, the area consumed will increase as the number of dielectric layers and metal layers increases. Therefore, it is difficult to utilize the conventional die seal structure for miniaturization of the integrated circuit.

SUMMARY OF THE INVENTION

Accordingly, the present invention provides a die seal structure to minimize die dimensions.

The present invention provides plugs in the die seal structure to facilitate fabrication.

Moreover, the plugs provided in the die seal structure of the present invention exert a total planarization effect on the semiconductor integrated circuit.

In a preferred embodiment of the present invention, a die seal structure between an integrated circuit and a scribe line over a semiconductor wafer is described. The die seal structure includes at least one dielectric layer in which forms at least one contact window. The die seal structure also has at least one plug filled in the contact windows of the dielectric layer.

DETAILED DESCRIPTION OF THE INVENTION

Figure 3:
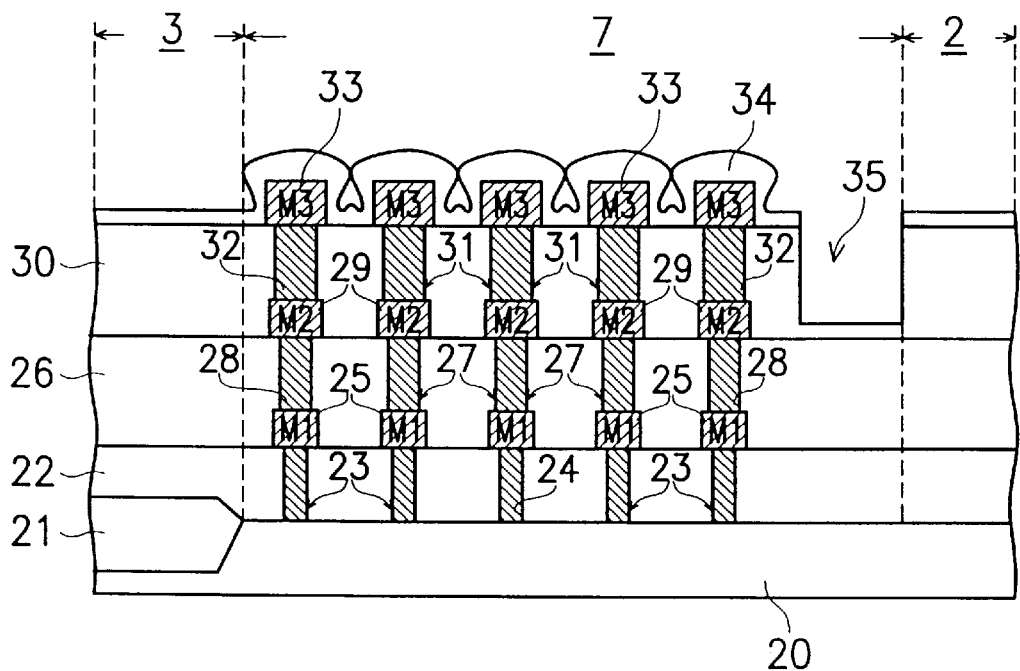
FIG. 3 is a cross-sectional view of the die seal structure according to an embodiment of the present invention.

Referring to FIG. 3, the die seal structure of the present embodiment includes three metal layers M1, M2 and M3. In practice, the die seal structure may have only one metal layer. However, the present embodiment describes a triple-level-metal die structure which illustrates the variation and complexity that such a structure may exhibit. The integrated circuit of the present invention is formed over silicon wafer 20. Moreover, die seal structure region 7 of the present invention is formed between integrated circuit region 3 and scribe line 2, as shown in the figure. Therefore, the die which contains the integrated circuit is encircled by the seal structure so that the sawing stress will not cause microcracking in the integrated circuit.

The three metal layers M1, M2 and M3 are formed over three dielectric layers 22, 26 and 30, respectively. Dielectric layer 22 is an interlevel dielectric (ILD) layer, while the other two dielectric layers 26 and 30 are both intermetal dielectric (IMD) layers. As shown in FIG. 3, dielectric layer 26 is formed over dielectric layer 22, and dielectric layer 30 is formed over dielectric layer 26.

In the present invention, plugs are utilized in the die seal structure to help the integrated circuit resist sawing stress, thus preventing the integrated circuit from incuring damage. Referring to FIG. 3, contact windows 23 are formed in dielectric layer 22, and then are filled with plugs 24. Similarly, contact windows 27 and 31 are formed in dielectric layers 26 and 30, and are filled with plugs 28 and 32, respectively. The contact windows 23, 27 and 31 can be formed by etching dielectric layers 22, 26 and 30. The plugs 24, 28 and 32 can be formed by first physical vapor depositing and/or chemical vapor depositing a metal layer, such as tungsten or aluminum, over the dielectric layers and filling into the contact windows thereof, and then etching back the metal layer to leave the portions inside the contact windows. Since the etching process of the dielectric layers and the formation of the plugs are custom semiconductor processes, they are consistent with the present semiconductor manufacturing technology. It is noted that plugs 24, 28 and 32 need not be connected electrically.

Figure 1:
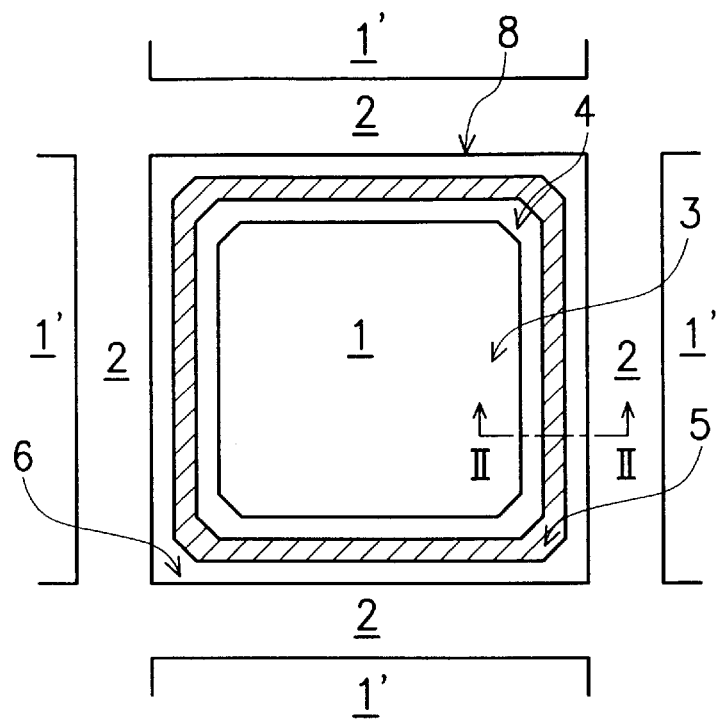
FIG. 1 is a top view of a die over a semiconductor wafer.
Figure 2:
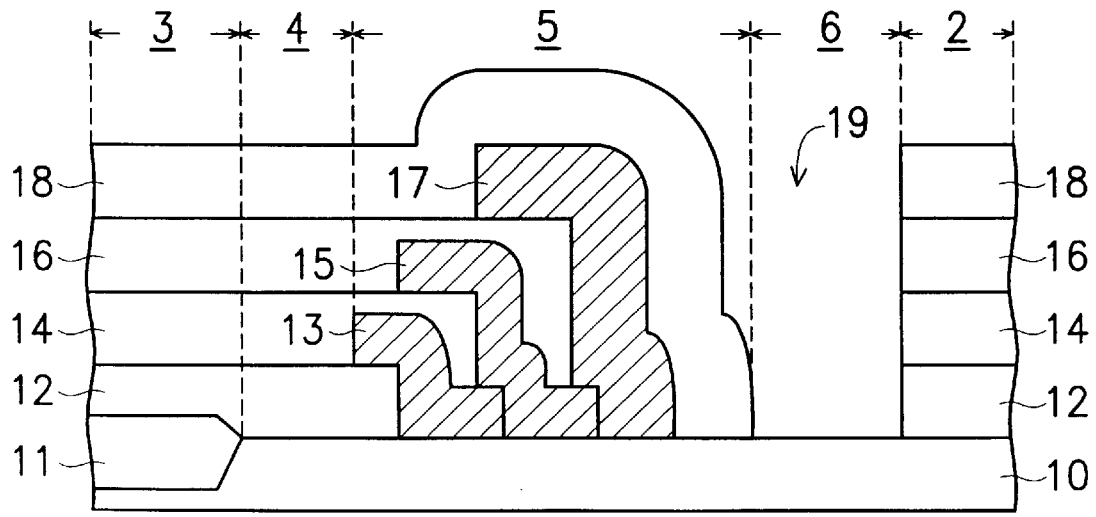
FIG. 2 is a cross-sectional view of the conventional die seal structure along line II—II in FIG. 1.

Moreover, in order to prevent the surface of the die seal structure from damage or contamination, passivation layer 34 can be formed thereon. The border of the die seal structure near scribe line 2 can include trench 35 which is formed by etching passivation layer 34 or even the dielectric layers (e.g. dielectric layer 30) to enhance the stress resistance. Trench 35 works in a way similar to buffer space 6 of FIG. 1. Furthermore, there can be spaces, similar to buffer region 4 of FIG. 1, between integrated circuit region 3 and plugs 24, 28 and 32. Therefore, the function of the plug structure in the present invention is similar to that of the seal ring shown in FIG. 1.

Figure 4:
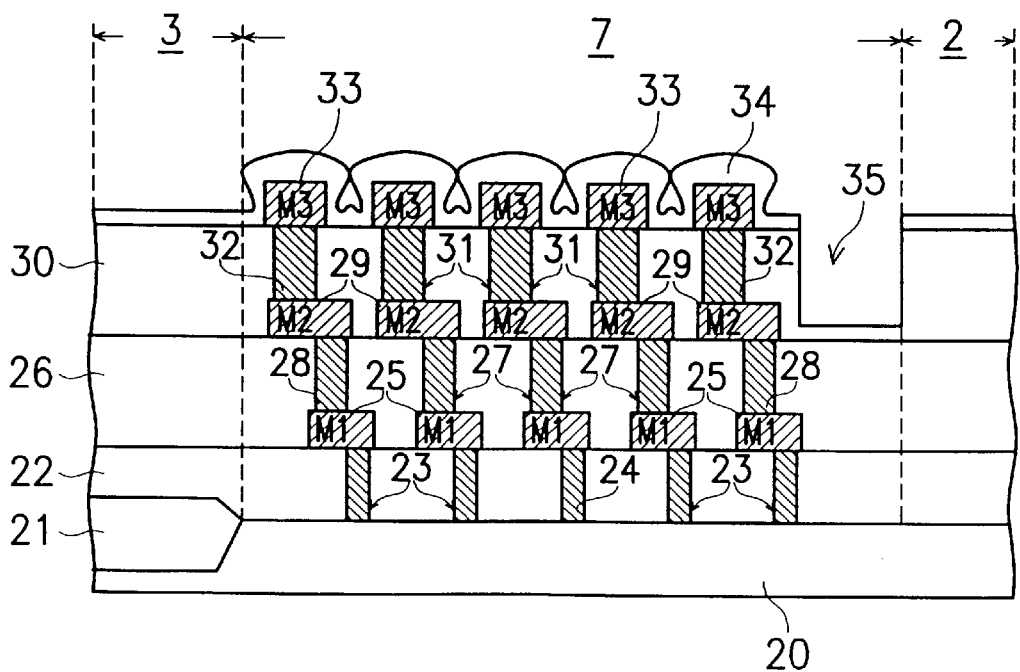
FIG. 4 is a cross-sectional view of the die seal structure according to another embodiment of the present invention.

FIG. 4 illustrates another embodiment of the present invention. The plugs in the die seal structure of this embodiment are not aligned. That is, even though the plugs are not aligned, the die seal structure performs the same functions.

Figure 5:
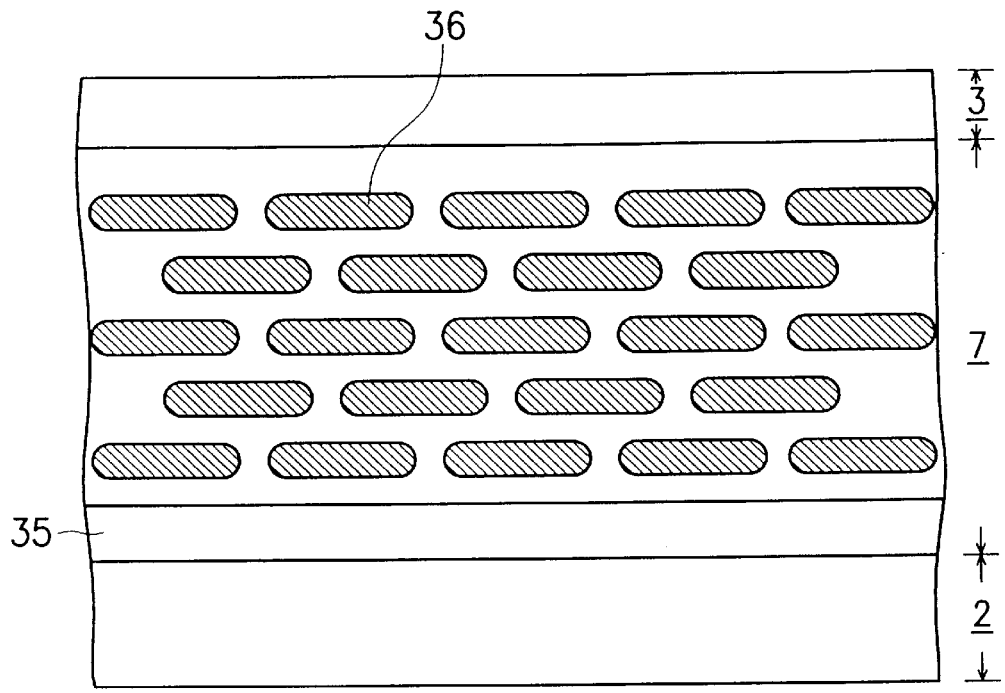
FIG. 5 is a top view illustrating a pattern of the die seal structure of FIG. 3 or FIG. 4.
Figure 6:
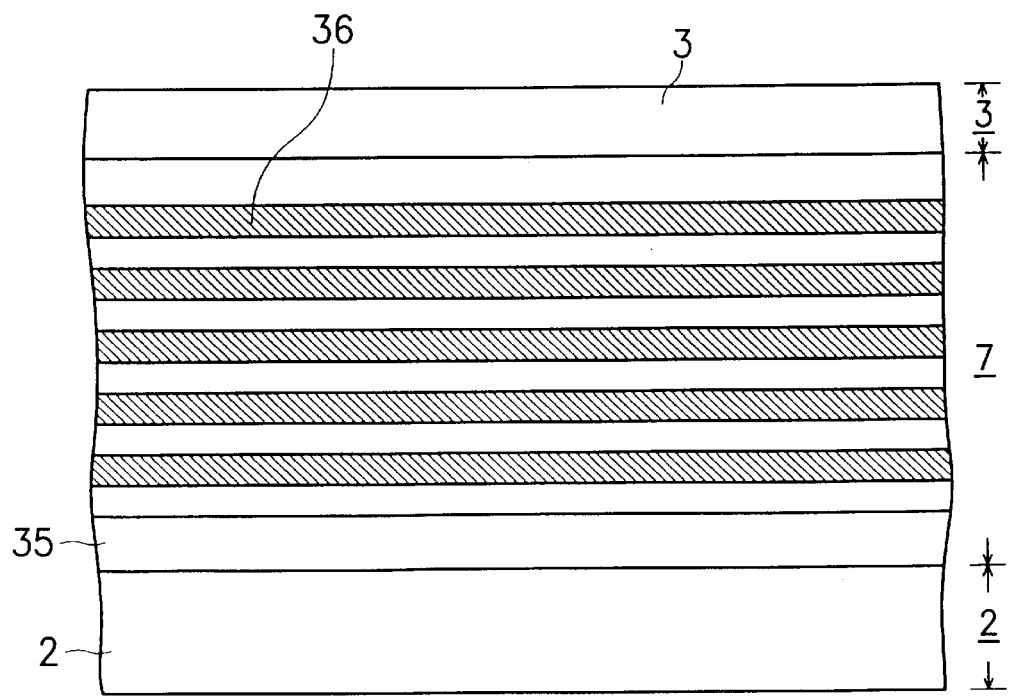
FIG. 6 is a top view illustrating another pattern the die seal structure of FIG. 3 or FIG. 4.
Figure 7:
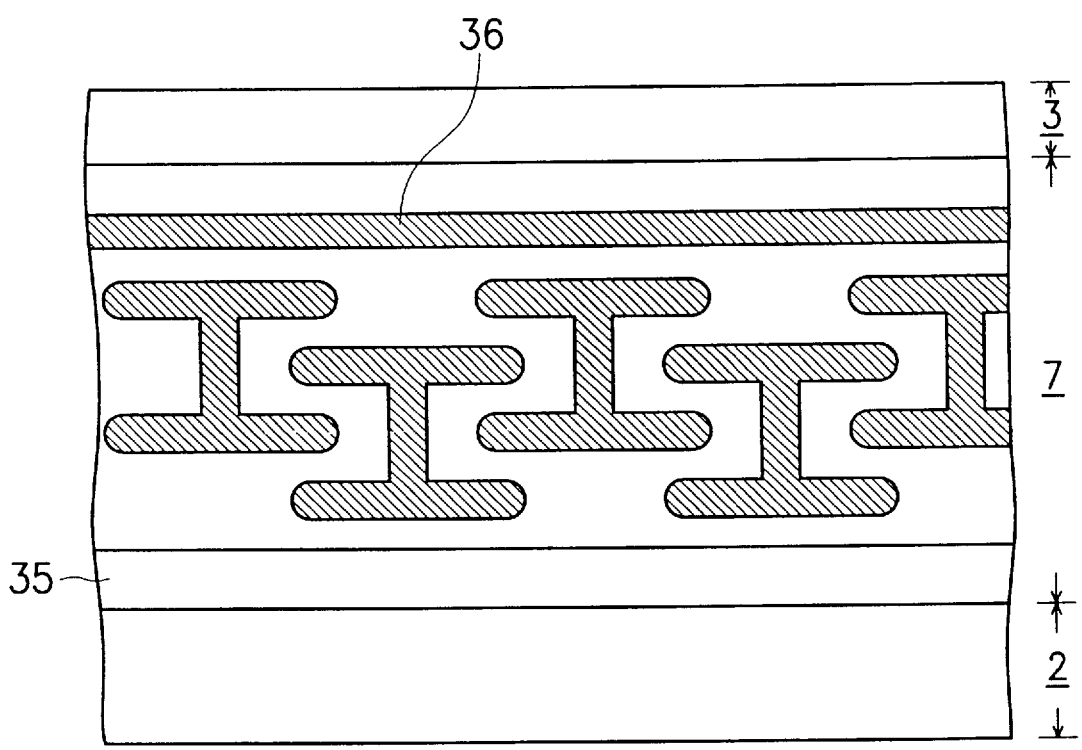
FIG. 7 is a top view illustrating yet another pattern of the die seal structure of FIG. 3 or FIG. 4.

The contact windows opened in the dielectric layer can have various shapes and patterns. For example, referring to FIG. 5, shapes 36 are depicted. In FIG. 5, shapes 36 are block-shaped and are staggered. When the wafer is sawed, the force on the scribe line 2 can be absorbed by these plug blocks, thus preventing stress on the integrated circuit region. Other possible plug shapes and patterns, such as those illustrated in FIG. 6 and FIG. 7, can also be utilized. The strip-shaped plugs in FIG. 6 and the H-shaped plugs in FIG. 7 can protect the integrated circuit from damage when the wafer is sawed.

The present invention therefore provides the advantages of:

1. reducing the dimensions of the die: for example, for a conventional 0.35 $\mu$m design rule, the traditional seal ring structure has a width of about 40 $\mu$m, while the die seal structure of the present invention has a width of not larger than 20 $\mu$m;

2. avoiding distortion of contact profile: when the process of the present invention is integrated with a chemical-mechanical-polishing (cmp) application, the plug structure can prevent certain contacts near an interlevel-dielectric (ILD) open area from profile distortion;

3. minimizing the over-etching time in metal etch process: since the topography of die seal is improved, the over-etching time can be reduced;

4. decreasing exposure energy in the photolithography step: since no deep trench is required in the die seal structure of the present invention, a thinner photo resist layer is employed, and the exposure energy can be reduced; and 5. requiring no additional mask and process step: the formation of the contact windows in the dielectric layers in the present invention takes place in the same step as that of dielectric pattern definition, and the plug formation occurs in the same step as that of interconnection line formation, i.e., only the lithography masks need to be modified.

What is claimed is:

1. A die seal structure between an integrated circuit region and a scribe line over a semiconductor wafer, comprising a dielectric layer having at least one H-shaped contact window over said semiconductor wafer, each said H-shaped contact window being filled with a plug.

2. The die seal structure as claimed in claim 1 further including at least one metal block over said dielectric layer.

3. The die seal structure as claimed in claim 1 further including a passivation layer over said dielectric layer and said contact window.

4. The die seal structure as claimed in claim 1 further including a trench on a border of said die seal structure near said scribe line.

5. The die seal structure as claimed in claim 1, wherein each said plug is made of metal.

6. A die seal structure between an integrated circuit region and a scribe line over a semiconductor wafer, comprising at least one dielectric layer, each of which has at least one H-shaped contact window, over said semiconductor wafer, each said H-shaped contact window being filled with a plug.

7. The die seal structure as claimed in claim 6 further including at least one metal block each over one of said dielectric layers.

8. The die seal structure as claimed in claim 6 further including a passivation layer over said dielectric layers and said contact window.

9. The die seal structure as claimed in claim 6 further including a trench on a border of said die seal structure near said scribe line.

10. The die seal structure as claimed in claim 6, wherein each said plug is made of metal.

* * * * *